(12) United States Patent
Ryu et al.

(10) Patent No.: US 11,277,119 B2
(45) Date of Patent: Mar. 15, 2022

(54) DIGITAL STEP ATTENUATOR AND METHOD FOR OPERATING A DIGITAL STEP ATTENUATOR

(71) Applicant: NXP USA, Inc.

(72) Inventors: Namsik Ryu, Chandler, AZ (US); Margaret A Szymanowski, Chandler, AZ (US); Chun-Wei Chang, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/844,954

(22) Filed: Apr. 9, 2020

(65) Prior Publication Data

US 2021/0320646 A1    Oct. 14, 2021

(51) Int. Cl.
*H03H 11/24* (2006.01)

(52) U.S. Cl.
CPC .................. *H03H 11/24* (2013.01)

(58) Field of Classification Search
CPC ..................................................... H03H 11/24
See application file for complete search history.

(56) References Cited

U.S. PATENT DOCUMENTS 9,584,096 B2    2/2017 Cho et al.
10,483,945 B2  11/2019 Joish et al.
2015/0326204 A1*  11/2015 Cho ..................... H04M 1/0277
                                                         327/308
2016/0373086 A1  12/2016 Shrivastava et al.
2017/0207769 A1   7/2017 Shrivastava
2018/0054178 A1*  2/2018 Bergsma ................ H03H 7/253
2019/0068167 A1   2/2019 Bacon et al.

OTHER PUBLICATIONS

Jarihani, Arash Ebrahimi et al.; "A Phase Coherent 7-bit Digital Step Attenuator on 0.18 μm SOU"; Proceedings of the 12th European Microwave Integrated Circuits Conference, Nuremberg, DE; 4 pages (Dec. 21, 2017).

* cited by examiner

*Primary Examiner* — Sibin Chen

(57) ABSTRACT

Embodiments of a digital step attenuator are disclosed. In an embodiment, a digital step attenuator includes a radio frequency (RF) input, an RF output, an attenuation circuit connected between the RF input and the RF output, a shunt switching circuit connected to the attenuator circuit, and a bypass switching circuit connected between the RF input and the RF output. The bypass switching circuit includes a first bypass transistor, and a second bypass transistor, wherein the first bypass transistor and the second bypass transistor are series connected to each other between the RF input and the RF output, and a bypass shunt transistor connected between the first bypass transistor and the second bypass transistor.

16 Claims, 12 Drawing Sheets

DIGITAL STEP ATTENUATOR AND METHOD FOR OPERATING A DIGITAL STEP ATTENUATOR

BACKGROUND

In radio frequency (RF) communications systems such as 5G massive MIMO (mMIMO) systems, digital step attenuators (DSAs) can be used to attenuate an RF signal before the RF signal is provided to subsequent components such as filters, amplifiers, phase shifters, or modulators. DSAs tend to impart an undesirable phase shift on attenuated signals and in mMIMO systems, dealing with phase shift is especially important due to the large number of signal paths. Some approaches to dealing with phase shift involve using lookup tables to compensate for phase shift while other approaches involve attenuator designs that aim to reduce phase shift.

SUMMARY

Embodiments of a digital step attenuator are disclosed. In an embodiment, a digital step attenuator includes a radio frequency (RF) input, an RF output, an attenuation circuit connected between the RF input and the RF output, a shunt switching circuit connected to the attenuator circuit, and a bypass switching circuit connected between the RF input and the RF output. The bypass switching circuit includes a first bypass transistor, and a second bypass transistor, wherein the first bypass transistor and the second bypass transistor are series connected to each other between the RF input and the RF output, and a bypass shunt transistor connected between the first bypass transistor and the second bypass transistor.

In an embodiment, gates of the first bypass transistor and the second bypass transistor are connected to a first gate terminal, and gates of a shunt transistor of the shunt switching circuit and of the bypass shunt transistor are connected to a second gate terminal.

In an embodiment, the bypass shunt transistor is configured such that a parasitic capacitance of the bypass shunt transistor is matched between a bypass mode and an attenuation mode.

In an embodiment, a gate of the first bypass transistor is connected to a first gate terminal and a gate of the second bypass transistor is electrically connected to the first gate terminal, and a gate of the bypass shunt transistor is electrically connected to a second gate terminal.

In an embodiment, the shunt switching circuit includes a shunt transistor, wherein a gate of the shunt transistor is electrically connected to the second gate terminal.

In an embodiment, a gate of the first bypass transistor is connected, via a first gate resistor, to a first gate terminal, and a gate of the second bypass transistor is connected, via a second gate resistor, to the first gate terminal, and a gate of the bypass shunt transistor is electrically connected, via a third gate resistor, to a second gate terminal.

In an embodiment, the shunt switching circuit includes a shunt transistor, wherein a gate of the shunt transistor is electrically connected, via a fourth gate resistor, to the second gate terminal.

In an embodiment, the bypass shunt transistor is configured such that a parasitic capacitance of the bypass shunt transistor is matched between a bypass mode and an attenuation mode.

In an embodiment, the first and second bypass transistors are n-type transistors in which a source of the first bypass transistor is electrically connected to the RF input, a drain of the first bypass transistor is electrically connected to a source of the second bypass transistor, and a drain of the second bypass transistor is electrically connected to the RF output, a gate of the first bypass transistor is connected, via a first gate resistor, to a first gate terminal, and a gate of the second bypass transistor is connected, via a second gate resistor, to the first gate terminal, and the bypass shunt transistor is electrically connected between the first bypass transistor and the second bypass transistor, the bypass shunt transistor is an n-type transistor that includes a drain electrically connected between the drain of the first bypass transistor and the source of the second bypass transistor, and a gate of the bypass shunt transistor is electrically connected, via a third gate resistor, to a second gate terminal.

In an embodiment, the attenuation circuit includes a first attenuation resistor, a second attenuation resistor, a third attenuation resistor, and a fourth attenuation resistor, wherein the third attenuation resistor is electrically connected in parallel with the first and second attenuation resistors, and the fourth attenuation resistor is electrically connected between a second end of the first attenuation resistor and a first end of the second attenuation resistor.

In an embodiment, the attenuation circuit includes a first attenuation resistor, a second attenuation resistor, a first digitally controllable resistor bank, and a second digitally controllable resistor bank, wherein the first digitally controllable resistor bank is electrically connected in parallel with the first and second attenuation resistors, and the second digitally controllable resistor bank is electrically connected between a second end of the first attenuation resistor and a first end of the second attenuation resistor.

In an embodiment, the first digitally controllable resistor bank includes resistors and switches corresponding to the resistors, wherein the switches can be turned on or off to set a level of resistance that is provided by the first digitally controllable resistor bank, and wherein the second digitally controllable resistor bank includes resistors and switches corresponding to the resistors, wherein the switches can be turned on or off to set a level of resistance that is provided by the second digitally controllable resistor bank.

In an embodiment, the RF input, the RF output, the attenuation circuit, the shunt switching circuit, and the bypass switching circuit comprise a unit digital step attenuator, the digital step attenuator including multiple unit digital step attenuators electrically connected to each other.

A method for operating a digital step attenuator is also disclosed. The method involves operating the digital step attenuator in a bypass mode by putting first and second bypass transistors in an on state and putting a shunt transistor and a bypass shunt transistor in an off state, switching the digital step attenuator from the bypass mode to an attenuation mode, and operating the digital step attenuator in the attenuation mode by putting the first and second bypass transistors in an off state and putting the shunt transistor and the bypass shunt transistor in an on state, wherein the first bypass transistor and the second bypass transistor are series connected to each other between a radio frequency (RF) input and an RF output of the digital step attenuator, and the bypass shunt transistor is connected between the first bypass transistor and the second bypass transistor.

In an embodiment of the method, the first and second bypass transistors are controlled by a first control signal and the shunt transistor and bypass shunt transistor are controlled by a second control signal.

In an embodiment of the method, the bypass shunt transistor is configured such that a parasitic capacitance of the bypass shunt transistor is matched between a bypass mode and an attenuation mode.

An RF system is also disclosed. The RF system includes a digital step attenuator including an RF input, an RF output, an attenuation circuit connected between the RF input and the RF output, and a shunt switching circuit connected to the attenuator circuit, the shunt switching circuit including a shunt transistor, and a bypass switching circuit connected between the RF input and the RF output. The bypass switching circuit includes a first bypass transistor, a second bypass transistor, wherein the first bypass transistor and the second bypass transistor are series connected to each other between the RF input and the RF output, and a bypass shunt transistor connected between the first bypass transistor and the second bypass transistor, wherein gates of the first bypass transistor and the second bypass transistor are electrically connected to a first gate terminal, and gates of the shunt transistor and the bypass shunt transistor are connected to a second gate terminal.

In an embodiment of the system, the bypass shunt transistor is configured such that a parasitic capacitance of the bypass shunt transistor is matched between a bypass mode and an attenuation mode.

In an embodiment, the system further includes digital control logic that is configured to provide control signals to the digital step attenuator to control the state of the first and second bypass transistors and to provide control signals to the bypass shunt transistor to control the state of the bypass shunt transistor.

In an embodiment of the system, the first and second bypass transistors are n-type transistors in which a source of the first bypass transistor is electrically connected to the RF input, a drain of the first bypass transistor is electrically connected to a source of the second bypass transistor, and a drain of the second bypass transistor is electrically connected to the RF output, a gate of the first bypass transistor is connected, via a first gate resistor to a first gate terminal, and a gate of the second bypass transistor is connected, via a second gate resistor to the first gate terminal, and the bypass shunt transistor is electrically connected between the first bypass transistor and the second bypass transistor, the bypass shunt transistor is an n-type transistor that includes a drain electrically connected between the drain of the first bypass transistor and the source of the second bypass transistor, a gate of the bypass shunt transistor is electrically connected, via a third gate resistor to a second gate terminal.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
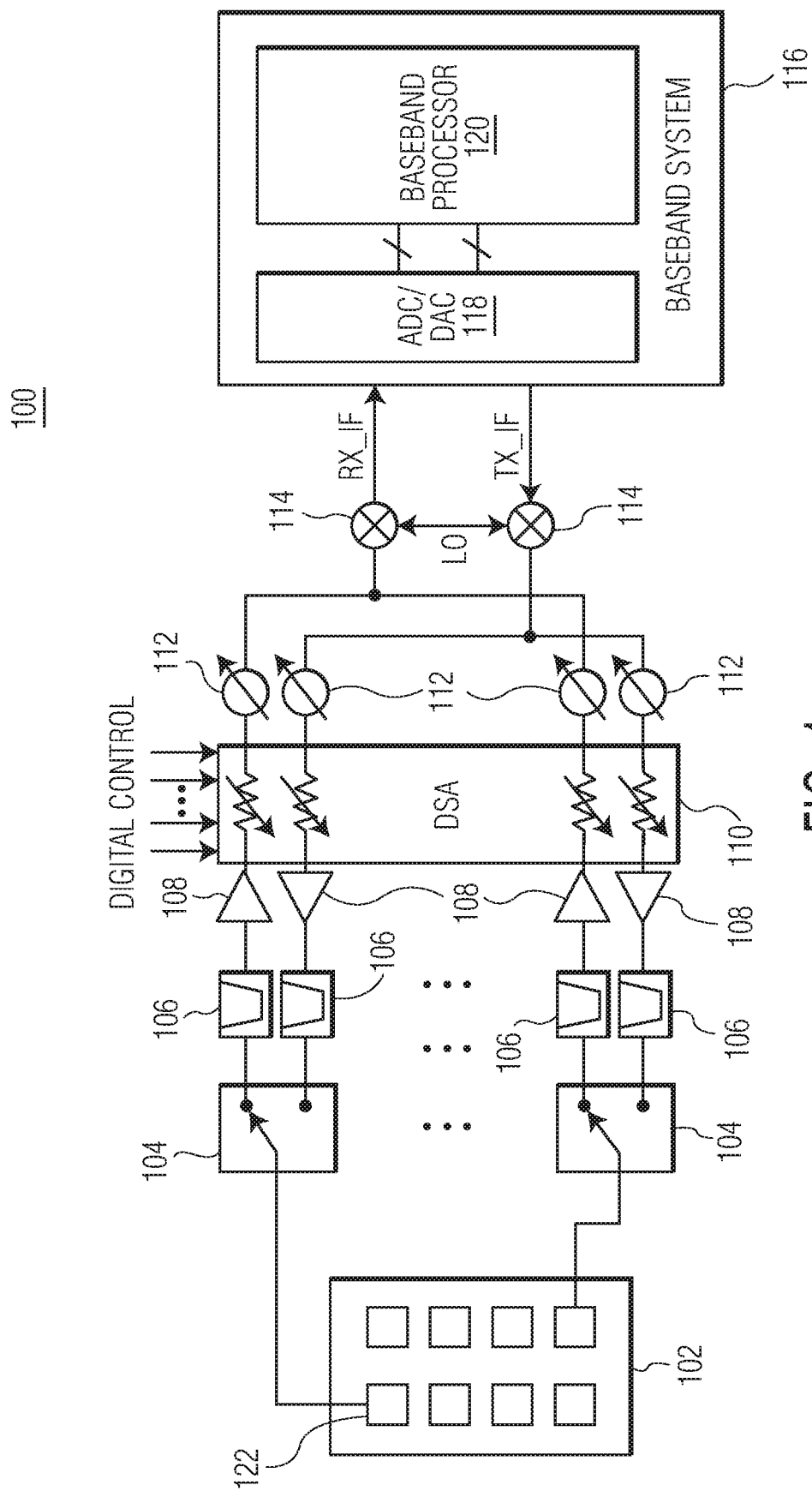
FIG. 1 depicts an example of an RF system in which a DSA may be used to attenuate analog RF signals.

FIG. 1 depicts an example of an RF system 100 in which a DSA may be used to attenuate analog RF signals. In an embodiment, the system is implemented in a massive multiple input/multiple output (mMIMO) communications system such as a 5G communications system. In the example of FIG. 1, the RF system includes an antenna array 102, switches 104, filters 106, amplifiers 108, a DSA 110, phase shifters 112, RF mixers 114, and a baseband system 116 that includes a converter 118 (e.g., analog-to-digital converters (ADCs) on the receive paths and digital-to-analog converters (DACs) on the transmit paths) and a baseband processor 120.

The antenna array 102 includes an array of antennas 122 that are, for example, tuned to frequencies used in 5G communications systems such as frequencies in the 2-5 gigahertz (GHz) range. In the example, the antenna array includes eight antennas although it should be understood that the antenna array may include a number of antennas other than eight.

The switches 104 are configured to switch between transmit paths and receive paths. In the example of FIG. 1, the switches are set to connect the corresponding antennas 122 to receive paths of the RF system 100.

The filters 106 are configured to filter analog RF signals. In an embodiment, the filters may be, for example, bandpass filters, band-stop filters, low-pass filters, and/or high-pass filters. The filters may be implemented as, for example, lumped-element inductor-capacitor (LC) filters or planar filters. Filters are known in the field of RF systems.

The amplifiers 108 include low noise amplifiers (LNAs) in the receive paths and power amplifiers (PAs), such as Doherty power amplifiers, for example, in the transmit paths. LNAs and PAs are known in the field of RF systems.

The DSA 110 is a digitally controlled attenuator that attenuates an incoming RF signal and outputs an attenuated RF signal. Embodiments of the DSA are described in more detail below.

The phase shifters 112 are configured to shift the phase of an incoming RF signal as is known in the field. The phase shifters may be implemented as, for example, switched-line, loaded-line, reflection, switched-filter, traveling-wave, and/or vector-modulator phase shifters. The phase shifters may have digital or analog control mechanisms.

The RF mixers 114 are configured to mix an incoming RF signal with a local oscillator (LO) signal as is known in the field. On the receive paths, incoming RF signals are down-converted to frequencies that are more easily handled by ADCs, and on the transmit paths, incoming RF signals are upconverted to frequencies that are used for RF transmissions.

Within the baseband system 116, ADCs of the converter 118 convert received analog RF signals to digital signals that can be processed by the baseband processor 120, and DACs of the converter convert digital signals from the baseband processor to analog signals that can be upconverted, amplified, and transmitted from the antennas 122 of the RF system 100. ADCs, DACs, and baseband processors are known in the field of RF communications systems.

The RF system 100 described with reference to FIG. 1 is provided as an example of an RF system in which a DSA may be utilized. Although one example of an RF system is described, a DSA as described herein may be utilized in RF systems that have other configurations. For example, a DSA may be located between RF components that are different from the specific configuration of RF components shown in FIG. 1.

Figure 2A:
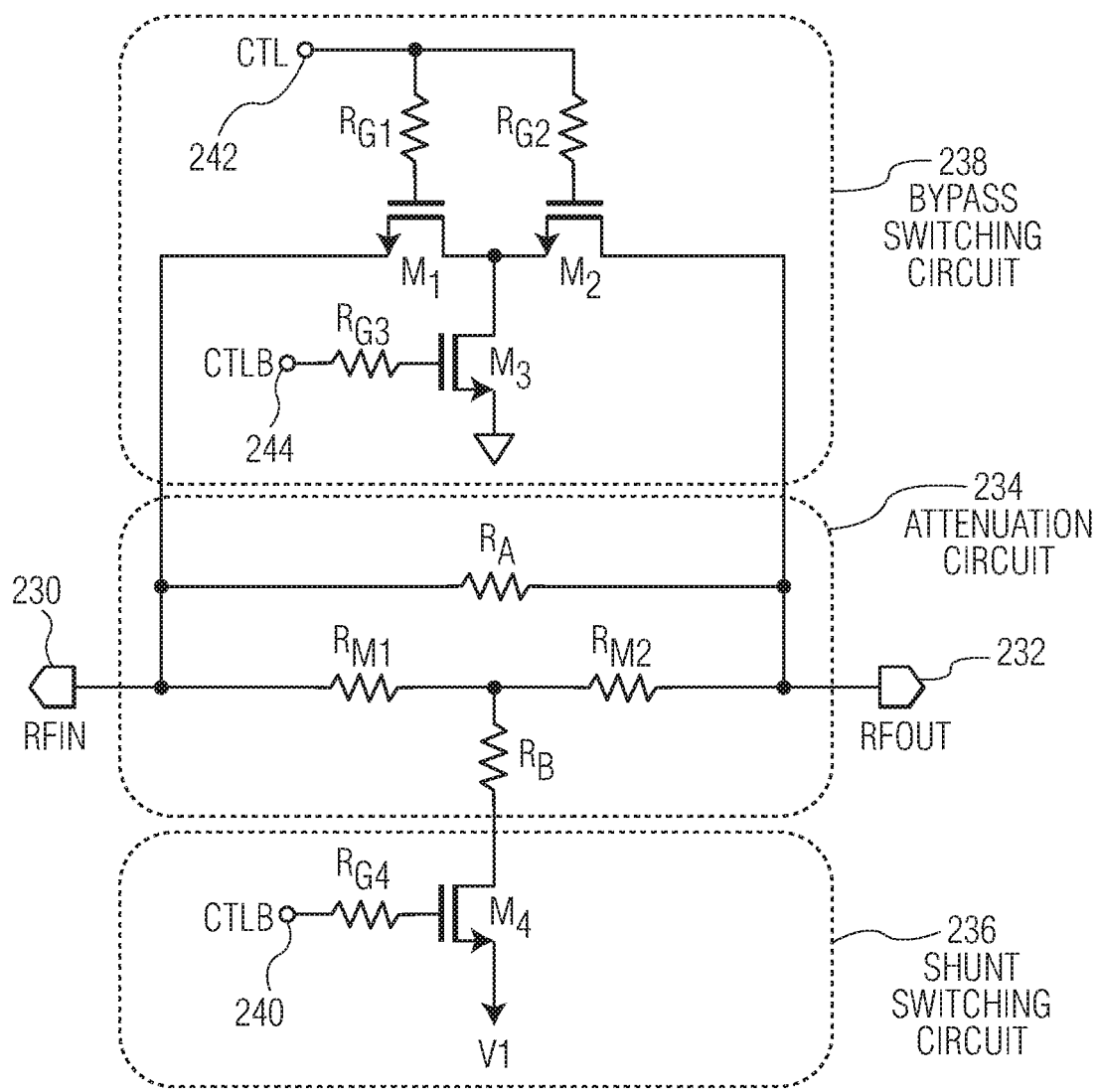
FIG. 2A depicts an embodiment of a DSA that includes a bypass switching circuit in which the bypass switching circuit includes two series connected bypass transistors and a bypass shunt transistor connected between the first bypass transistor and the second bypass transistor.

FIG. 2A depicts an embodiment of a DSA 210 that includes an RF input 230, RFIN, and RF output 232, RFOUT, an attenuation circuit 234, a shunt switching circuit 236, and a bypass switching circuit 238 in which the bypass switching circuit includes two series connected bypass transistors, $M_1$ and $M_2$, and a bypass shunt transistor, $M_3$, connected between the first bypass transistor, $M_1$, and the second bypass transistor, $M_2$.

Referring first to the attenuation circuit 234, the attenuation circuit includes four resistors, a first attenuation resistor, $R_{M1}$, a second attenuation resistor, $R_{M2}$, a third attenuation resistor, $R_A$, and a fourth attenuation resistor, $R_B$. The first attenuation resistor, $R_{M1}$, includes a first end electrically connected to the RF input, RFIN, and a second end electrically connected to the second attenuator resistor, $R_{M2}$. The second attenuator resistor, $R_{M2}$, has a first end electrically connected to the second end of the first attenuator resistor, $R_{M1}$, and a second end electrically connected to the RF output, RFOUT, such that the first and second attenuation resistors, $R_{M1}$ and $R_{M2}$, are electrically connected to each other in series. The third attenuation resistor, $R_A$, has a first end electrically connected to the RF input, RFIN, and a second end electrically connected to the RF output, RFOUT. The third attenuation resistor, $R_A$, is electrically connected in parallel to the series connected first and second attenuation resistors, $R_{M1}$ and $R_{M2}$. The fourth attenuation resistor, $R_B$, includes a first end electrically connected to a node between the second end of the first attenuation resistor, $R_{M1}$, and the first end of the second attenuation resistor, $R_{M2}$. A second end of the fourth attenuation resistor, $R_B$, is electrically connected to the shunt switching circuit 236. The first and second attenuation resistors, $R_{M1}$ and $R_{M2}$, are selected to provide input and output impedance matching. As is described below, the third and fourth attenuation resistors, $R_A$ and $R_B$, provide attenuation/resistance when the DSA is operated in an attenuation mode.

Referring now to the shunt switching circuit 236, the shunt switching circuit includes a shunt transistor, $M_4$, and a gate resistor, $R_{G4}$. In the embodiment of FIG. 2A, the shunt transistor, $M_4$, is an n-type transistor with a drain electrically connected to the second end of the fourth attenuation resistor, $R_B$, a source electrically connected to a voltage, V1 and a gate that is electrically connected, via the gate resistor, $R_{G4}$, to a gate terminal 240. The shunt transistor, $M_4$, can be turned on (i.e., conductive) and off (i.e., non-conductive) by a signal, CTLB, from digital control logic (not shown) that is applied at the gate terminal 240.

Referring now to the bypass switching circuit 238, the bypass switching circuit includes a first bypass transistor, $M_1$, and a second bypass transistor, $M_2$, that are series connected to each other between the RF input, RFIN, and the RF output, RFOUT. In the embodiment of FIG. 2A, the first and second bypass transistors, $M_1$ and $M_2$, are n-type transistors in which a source of the first bypass transistor, $M_1$, is electrically connected to the RF input, RFIN, a drain of the first bypass transistor, $M_1$, is electrically connected to a source of the second bypass transistor, $M_2$, and a drain of the second bypass transistor, $M_2$, is electrically connected to the RF output, RFOUT. A gate of the first bypass transistor, $M_1$, is connected, via a gate resistor, $R_{G1}$, to a gate terminal 242 and a gate of the second bypass transistor, $M_2$, is connected, via a gate resistor, $R_{G2}$, to the gate terminal 242. The first and second bypass transistors, $M_1$ and $M_2$, can be turned on (i.e., conductive) and off (i.e., non-conductive) by a signal, CTL, from digital control logic (not shown) that is applied at the gate terminal 242. The bypass switching circuit 238 also includes a bypass shunt transistor, $M_3$, connected between the first bypass transistor, $M_1$, and the second bypass transistor, $M_2$. In the embodiment of FIG. 2A, the bypass shunt transistor, $M_3$, is an n-type transistor that includes a drain electrically connected to a node between the drain of the first bypass transistor, $M_1$, and the source of the second bypass transistor, $M_2$. A gate of the bypass shunt transistor, $M_3$, is electrically connected, via a gate resistor $R_{G3}$, to a gate terminal 244. The bypass shunt transistor, $M_3$, can be turned on and off by the control signal, CTLB, from digital control logic that is applied at the gate terminal 244. It should be noted that in the embodiment of FIG. 2A, the gate terminals 240 and 244 receive the same control signal, CTLB, but may be a common terminal or separate terminals. Further, although reference is made above (and elsewhere herein) to connections to a drain or a source of a transistor, connections to these terminals may be reversed.

Figure 2B:
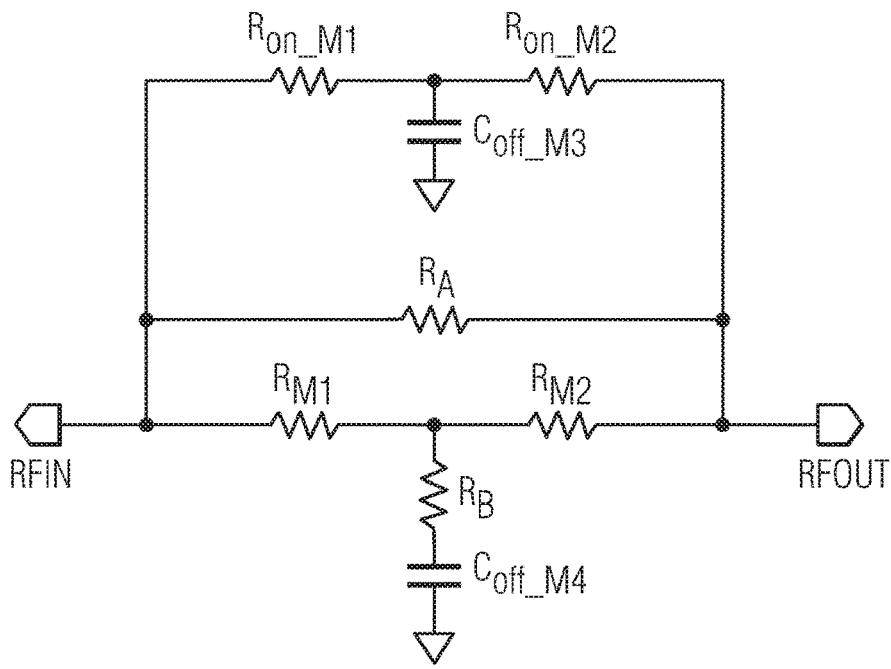
FIG. 2B is a circuit diagram that represents the DSA from FIG. 2A when the DSA is operated in the bypass mode.

The DSA 210 depicted in FIG. 2A can be operated in a bypass mode or in an attenuation mode. Operation in the bypass mode and in the attenuation mode is described below with reference to FIGS. 2B-2D. FIG. 2B is a circuit diagram that represents the DSA 210 from FIG. 2A when the DSA is operated in the bypass mode. When operated in the bypass mode, the first bypass transistor, $M_1$, and the second bypass transistor, $M_2$, are in an on state and the bypass shunt transistor, $M_3$, and the shunt transistor, $M_4$, are in an off state. As shown in the circuit diagram of FIG. 2B, the first bypass transistor, $M_1$, and the second bypass transistor, $M_2$, are represented by resistors, $R_{on\_M1}$ and $R_{on\_M2}$, respectively, the bypass shunt transistor, $M_3$, is represented by a capacitor, $C_{off\_M3}$, and the shunt transistor, $M_4$, is represented by capacitor, $C_{off\_M4}$. In an embodiment, the resistance, $R_{on\_M1}$ and $R_{on\_M2}$, is very low (e.g., on the order of 0.5-1 ohm) compared to the resistance of the attenuation resistors, $R_{M1}$, $R_{M2}$, $R_A$, and $R_B$ (e.g., 50-500 ohms) such that the resistance of the attenuation resistors can be ignored in the equivalent circuit. Additionally, the total parasitic capacitance of the circuit in the state as shown in FIG. 2B can be represented as $C_{off\_M3}+C_{off\_M4}$. In the state that corresponds to the bypass mode, an RF signal at the RF input, RFIN, passes through the bypass switching circuit 238 to the RF output, RFOUT, with lower resistance (e.g., negligible resistance) and thus lower attenuation than when in the state that corresponds to the attenuation mode.

Figure 2C:
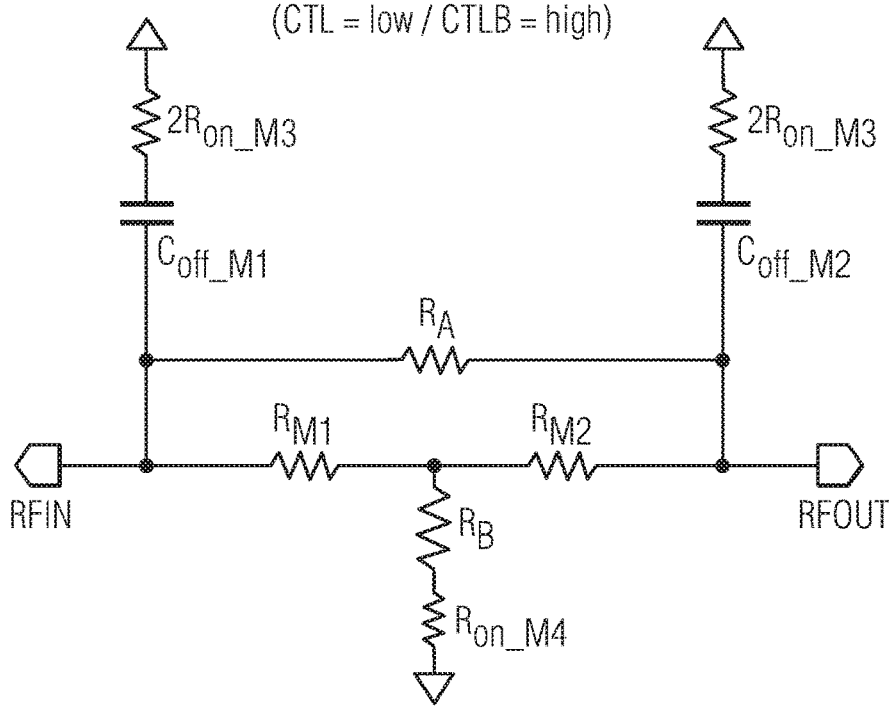
FIG. 2C is a circuit diagram that represents the DSA from FIG. 2A when the DSA is operated in the attenuation mode.

FIG. 2C is a circuit diagram that represents the DSA 210 from FIG. 2A when the DSA is operated in the attenuation mode. When operated in the attenuation mode, the first bypass transistor, $M_1$, and the second bypass transistor, $M_2$, are in an off state and the bypass shunt transistor, $M_3$, and the shunt transistor, $M_4$, are in an on state. As shown in the circuit diagram of FIG. 2C, the first bypass transistor, $M_1$, and the second bypass transistor, $M_2$, are represented by capacitors, $C_{off\_M1}$ and $C_{off\_M2}$, respectively, the bypass shunt transistor, $M_3$, is represented by resistance, $2R_{on\_m3}$, associated with each bypass transistor, $M_1$ and $M_2$, and the shunt transistor, $M_4$, is represented by resistance, $R_{on\_M4}$. In an embodiment, the resistance, $R_{on\_M3}$ and $R_{on\_M4}$, is very low (e.g., on the order of 0.5-1 ohm) compared to the resistance of the attenuation resistors, $R_{M1}$, $R_{M2}$, $R_A$, and $R_B$ (e.g., 50-500 ohms) and the attenuation resistors are designed to match with the termination impedance (e.g., approximately 50 ohm, although the termination impedance could be lower or higher). Additionally, the total parasitic capacitance of the circuit in the state as shown in FIG. 2C can be represented as $C_{off\_M1}+C_{off\_M2}$. In the state that corresponds to the attenuation mode, an RF signal at the RF input, RFIN, passes through the attenuation circuit 234 to the RF output, RFOUT, with higher resistance and thus higher attenuation than when in the state that corresponds to the bypass mode.

Figure 2D:
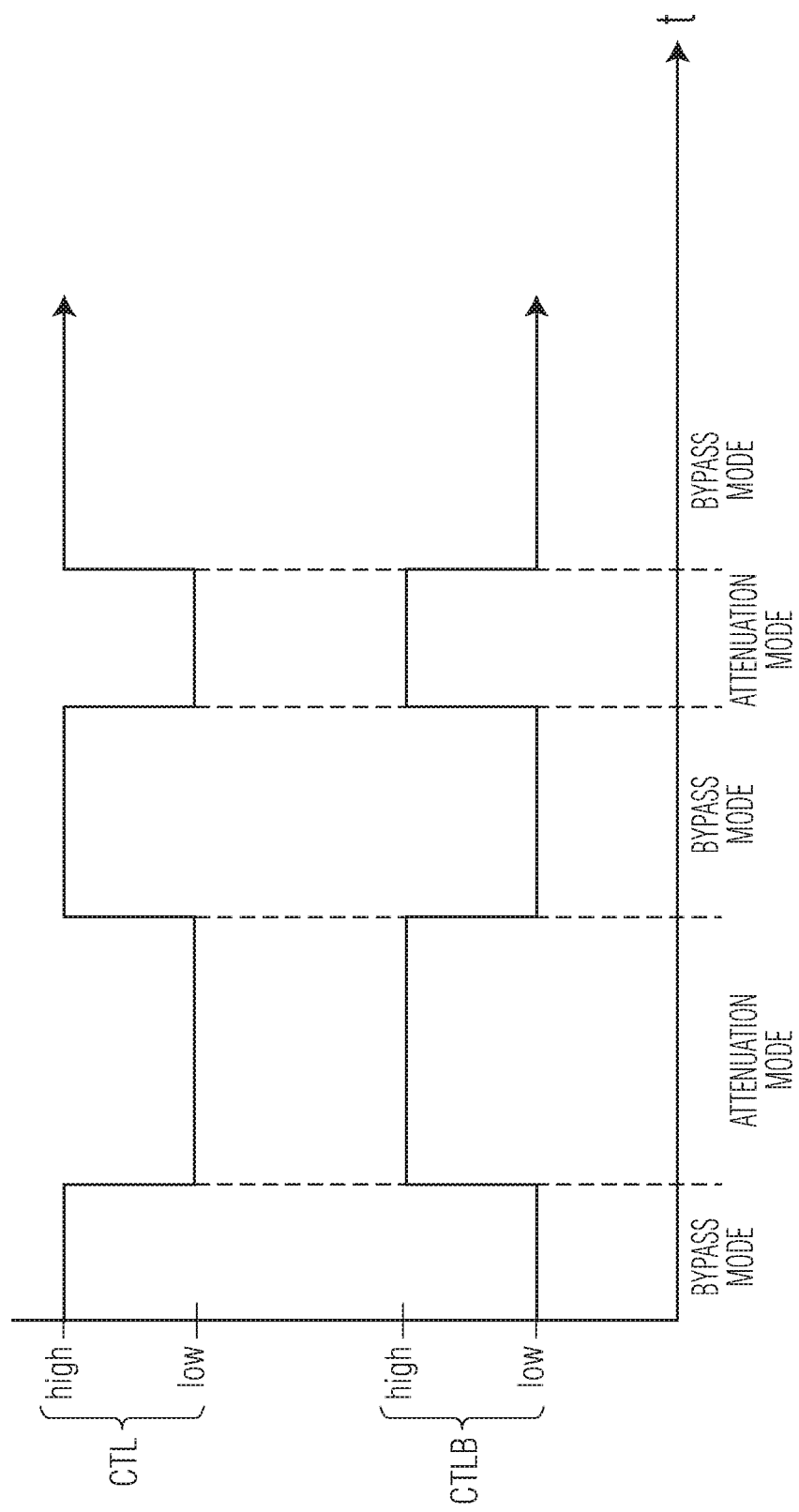
FIG. 2D is an example of a signal diagram that includes values of the control signals versus time.

As described above with reference to FIG. 2A, the first bypass transistor, $M_1$, and the second bypass transistor, $M_2$, can be turned on and off by a control signal, CTL, applied at the respective gates and the bypass shunt transistor, $M_3$, and the shunt transistor, $M_4$, can be turned on and off by a control signal, CTLB, applied at the respective gates. FIG. 2D is an example of a signal diagram that includes values of the control signals, CTL and CTLB, versus time (t). In the example of FIG. 2D, a "low" signal puts the corresponding transistors into an off state (i.e., a non-conductive state) and a "high" signal puts the corresponding transistors into an on state (i.e., a conductive state). As shown in FIG. 2D, when the DSA is operated in the bypass mode, the control signal, CTL, is high and the control signal, CTLB, is low and when the DSA is operated in the attenuation mode, the control signal, CTL, is low and the control signal, CTLB, is high. Accordingly, when the control signal, CTL, is high and the control signal, CTLB, is low, the DSA can be represented by the circuit shown in FIG. 2B (bypass mode) and when the control signal, CTL, is low and the control signal, CTLB, is high the DSA can be represented by the circuit shown in FIG. 2C (attenuation mode). As shown in FIGS. 2B-2D, the first bypass transistor, $M_1$, and the second bypass transistor, $M_2$, are controlled by the same control signal, CTL, and thus are switched between on and off states in unison. Likewise, the bypass shunt transistor, $M_3$, and the shunt transistor, $M_4$, are controlled by the same control signal, CTLB, and thus are switched between on and off states in unison. The control signals, CTL and CTLB, enable digital control of the DSA.

With the above-described DSA operated as described above, phase shift in the bypass mode (FIG. 2B) is a function of the off-state parasitic capacitance that is present at the drain node of the bypass shunt transistor, $M_3$, and the parasitic capacitance of the shunt transistor, $M_4$, and phase shift in the attenuation mode (FIG. 2C) is a function of the parasitic capacitance of the first bypass transistor, $M_1$, and the parasitic capacitance of the second bypass transistor, $M_2$. The parasitic capacitance of the circuit in the bypass mode (FIG. 2B) is represented as $C_{off\_M3}+C_{off\_M4}$ and the parasitic capacitance of the circuit in the attenuation mode (FIG. 2C) is represented as $C_{off\_M1}+C_{off\_M2}$. In order to provide phase shift coherence between the bypass mode and the attenuation mode, it is desirable to match the parasitic capacitance in the bypass mode (e.g., $C_{off\_M3}+C_{off\_M4}$) to the parasitic capacitance in the attenuation mode (e.g., $C_{off\_M1}+C_{off\_M2}$).

In an embodiment, the parasitic capacitance in the bypass mode ($C_{off\_M1}+C_{off\_M2}$) can be matched to the parasitic capacitance in the attenuation mode by adjusting the parasitic capacitance, $C_{off\_M3}$, of the bypass shunt transistor, $M_3$. For example, the parasitic capacitance of the bypass shunt transistor can be adjusted by adjusting the size of the transistor.

Figure 2E:
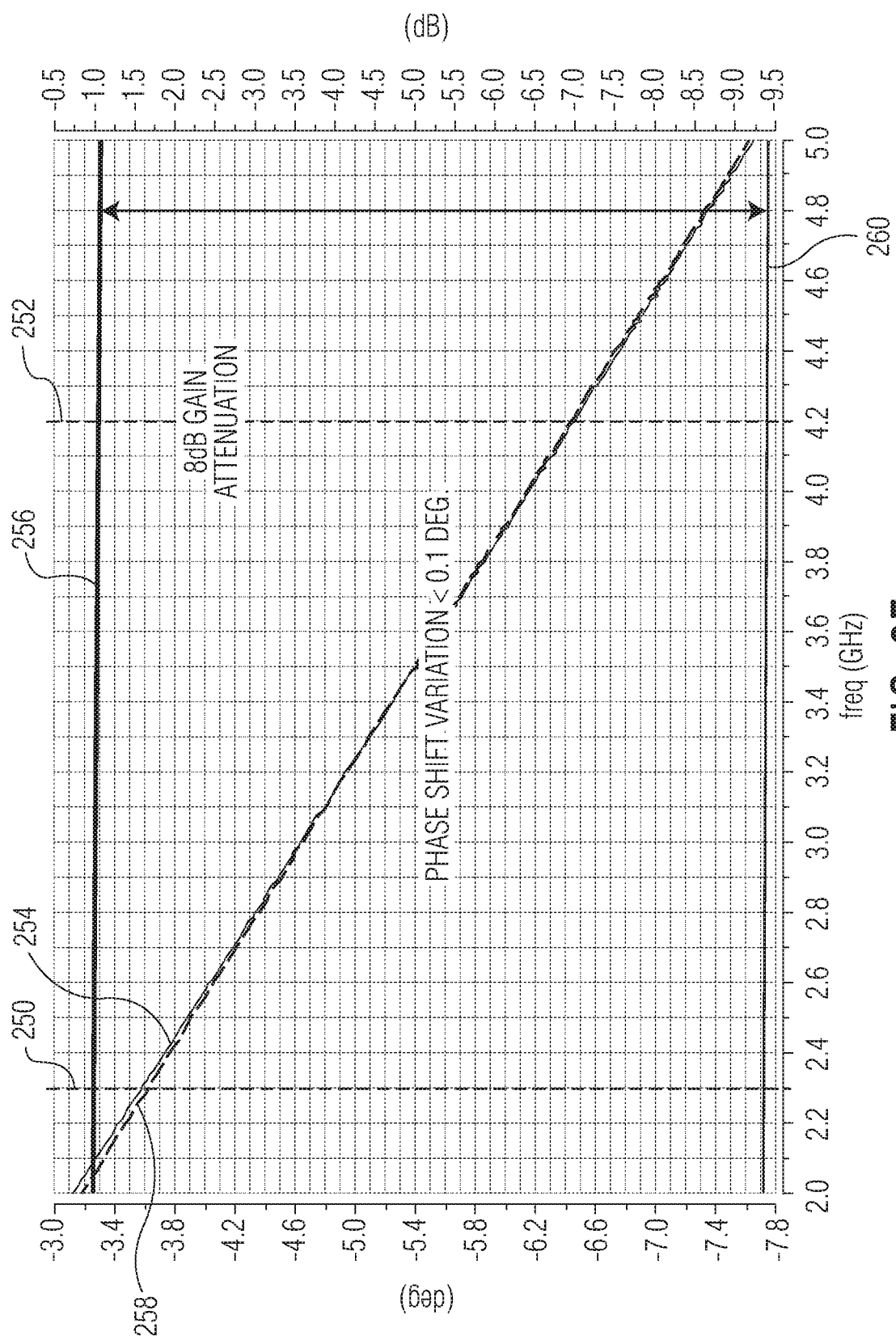
FIG. 2E is an example graph of simulation results that shows phase coherence between the bypass mode and the attenuation mode as exhibited by a DSA that is configured and operated as described above with reference to FIGS. 2A-2D.

FIG. 2E is an example graph of simulation results that shows phase coherence between the bypass mode and the attenuation mode as exhibited by a DSA that is configured and operated as described above with reference to FIGS. 2A-2D. In the graph of FIG. 2E, the horizontal axis (x-axis) corresponds to frequency in gigahertz (GHz) from 2-5 GHz, the left-side vertical access (y-axis) corresponds to phase shift (e.g., in degrees), and the right-side vertical axis (y-axis) corresponds to attenuation in decibels (dB). In the example of FIG. 2E, data was collected at 2.3 GHz and 4.2 GHz as indicated by the vertical dashed lines 250 and 252, respectively. The solid diagonal line 254 in the graph shows the phase shift that is imparted on an RF signal across a range of frequencies, e.g., 2-5 GHz, when the DSA is in the bypass mode (e.g., −1.0 decibel (dB) attenuation as indicated by the line horizontal line 256), and the dashed diagonal line 258 in the graph shows the phase shift that is imparted on an RF signal across a range of frequencies, e.g., 2-5 GHz, when the DSA is in the attenuation mode (e.g., −9.0 dB attenuation as indicated by the horizontal line 260). Most importantly, the graph shows that the phase shift imparted on an RF signal in the bypass mode (diagonal line 254) and the phase shift imparted on an RF signal in the attenuation mode (diagonal line 258) are closely aligned to each other across the range of frequencies. In the example simulation depicted in FIG. 2E, it was found that the phase shift between the bypass mode and the attenuation mode varied less than 0.1 degrees over the 2-5 GHz frequency range. Thus, the DSA as described herein provides strong phase coherence across a wide frequency range.

Figure 3:
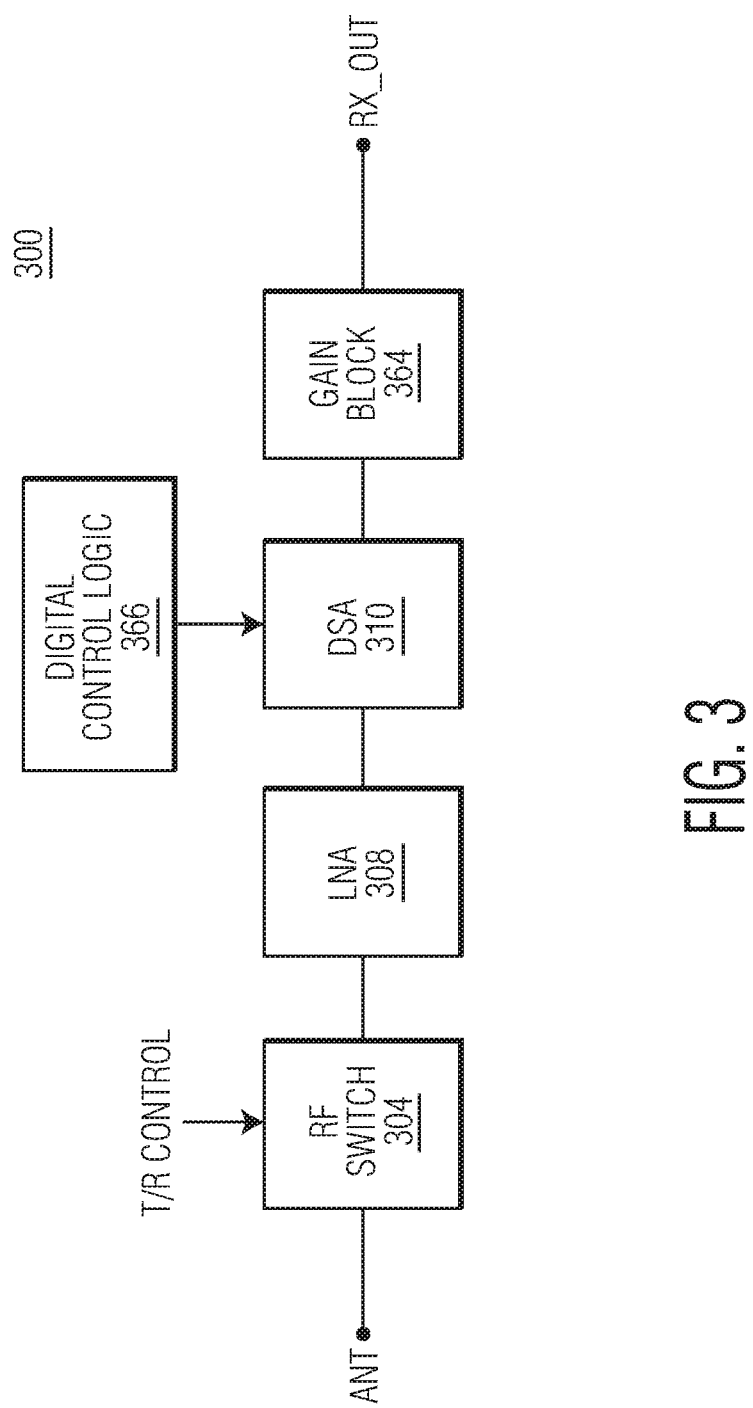
FIG. 3 depicts an example of a receive path of an RF system that includes an RF switch, an LNA, a DSA, a gain block, and digital control logic.

As described above with reference to FIG. 1, the DSA may be implemented in RF systems with different configurations. FIG. 3 depicts an example of a receive path of an RF system 300 that includes an RF switch 304, an LNA 308, a DSA 310, a gain block 364, and digital control logic 366. In the embodiment of FIG. 3, the RF switch is connected to an antenna via an antenna terminal, ANT, and switches between a transmit path and a receive path in response to a transmit/receive control signal before the RF signal is output as RX_OUT. The LNA amplifies the RF signal and the gain block imparts a gain on the RF signal. The DSA is configured with series connected bypass transistors and a bypass shunt transistor as described above with reference to FIGS. 2A-2D and the digital control logic is configured to provide digital control signals, e.g., CTL and CTLB, to the DSA to control the operation of the DSA. In the DSA, the RF input (RFIN) terminal is coupled to the LNA 308, and the RF output (RFOUT) terminal is coupled to the DSA 310.

Figure 4:
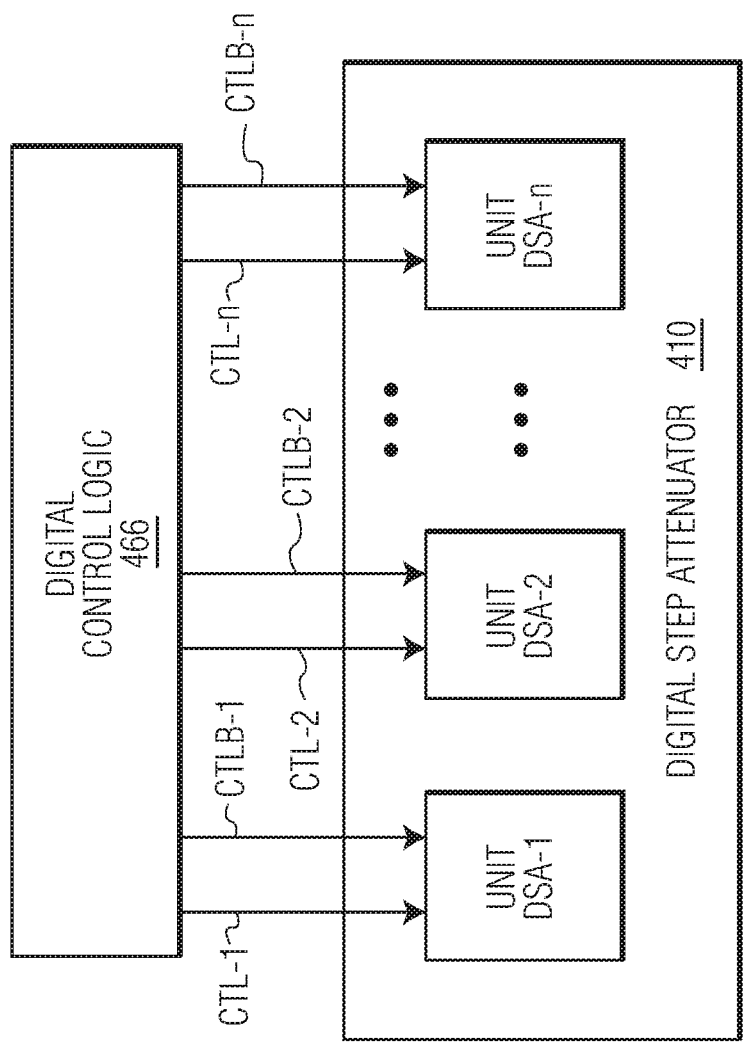
FIG. 4 depicts an embodiment of a DSA that includes multiple unit DSAs that can be individually controlled by digital control logic to achieve a target attenuation.

As described above with reference to FIGS. 2A-2D, the DSA 210 is controllable between a bypass mode and an attenuation mode. In the configuration shown in FIG. 2A, the DSA 210 provides a level of attenuation that corresponds to the characteristics of the third and fourth attenuation resistors, $R_A$ and $R_B$. In some applications, it may be desirable to be able to provide different levels of attenuation with a DSA. In an embodiment, a DSA is configured with multiple DSAs that can be individually controlled, e.g., put into either bypass mode or attenuation mode (e.g., using the control signals CTL and CTLB), to achieve a target attenuation. FIG. 4 depicts an embodiment of a DSA 410 that includes multiple unit DSAs (unit DSA-1, unit DSA-2, . . . unit DSA-n) that can be individually controlled by digital control logic 466 to achieve a target attenuation. For example, each unit DSA is controlled by corresponding control signals (e.g., CTL-1 and CTLB-1, CTL-2 and CTLB-2, and CTL-n and CTLB-n,) In the example of FIG. 4, each unit DSA is configured to provide the same level of attenuation (e.g., 8 dB, although the attenuation level could be lower or higher) and the level of attenuation that is provided by each of the DSAs is referred to as a "unit" attenuation. If the unit attenuation of a unit DSA is 8 dB, different levels of attenuation can be provided as follows:

| Number of DSAs in attenuation mode | Target Attenuation (dB) |
| --- | --- |
| 1 | 8 dB |
| 2 | 16 dB |
| 3 | 24 dB |
| . . . | . . . |
| n | n × 8 dB |

In an embodiment, the unit DSAs (unit DSA-1, unit DSA-2, . . . unit DSA-n) of the DSA 410 are linked together in series such that the RF input (RFIN) of a first unit DSA receives an input RF signal (e.g., from LNA 308), the RF output (RFOUT) of the first unit DSA is electrically connected to the RF input of a second unit DSA, the RF output of the second DSA is electrically connected to the RF input of a third unit DSA, and so on. Ultimately, the RF output of the n-th DSA corresponds to the RF output of the DSA 410 (e.g., which is provided to gain block 364). Each of the unit DSAs can be individually controlled by the digital control logic 466 either in the attenuation mode or the bypass mode. Those DSAs that are controlled to be in the attenuation mode each provide 8 dB of attenuation to the RF signal conveyed through the DSA 410, while those DSAs that are controlled to be in the bypass mode do not sufficiently attenuate the RF signal.

Although unit DSAs are described above as each providing the same level of attenuation, in other embodiments, unit DSAs may provide different levels of attenuation. For example, in a linearly increasing attenuation configuration, unit DSA-1 provides 1 dB of attenuation, unit DSA-2 provides 2.0 dB of attenuation, unit DSA-3 provides 3.0 dB of attenuation, and unit DSA-4 provides 4.0 dB of attenuation and in a non-linearly increasing attenuation configuration, unit DSA-1 provides 1.0 dB of attenuation, unit DSA-2 provides 2.0 dB of attenuation, unit DSA-3 provides 4.0 dB of attenuation, and unit DSA-4 provides 8.0 dB of attenuation. Other configurations of unit DSAs may be implemented.

In the embodiment described with reference to FIG. 4, different levels of attenuation can be provided by individually controlling the unit DSAs (unit DSA-1, unit DSA-2, . . . unit DSA-n) of the DSA 410. For example, in a configuration of unit DSAs in which each unit DSA provides 1.0 dB attenuation, 3.0 dB of attenuation can be provided by putting three of the unit DSAs into attenuation mode and putting the rest of the unit DSAs into bypass mode, e.g., using the control signals CTL and CTLB. In another example, in a configuration of unit DSAs in which unit DSA-1 provides 1.0 dB of attenuation, unit DSA-2 provides 2.0 dB of attenuation, unit DSA-3 provides 3 dB of attenuation, and unit DSA-4 provides 4 dB of attenuation, 5.0 dB of attenuation can be provided by putting unit DSA-2 (2.0 dB attenuation) and unit DSA-3 (3.0 dB attenuation) into attenuation mode and putting unit DSA-1 and unit DSA-4 into bypass mode.

Figure 5:
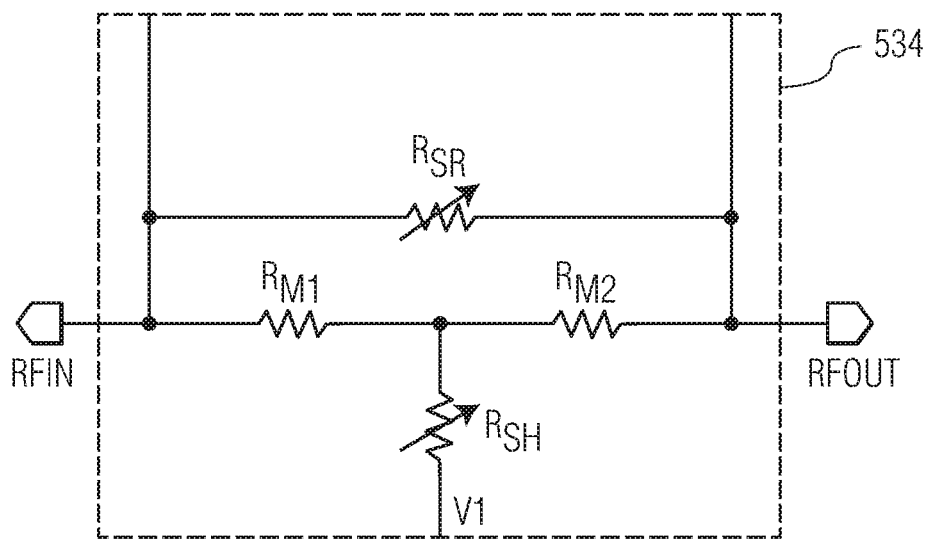
FIG. 5 depicts an attenuation circuit similar to the attenuation circuit of FIG. 2A in which the third and fourth attenuation resistors are represented as variable attenuation resistors.

In another embodiment, the level of attenuation can be adjusted by adjusting the magnitude of resistance in the attenuation circuit of a DSA. FIG. 5 depicts an attenuation circuit 534 similar to the attenuation circuit 234 of FIG. 2A in which the third and fourth attenuation resistors, $R_A$ and $R_B$, are represented as variable attenuation resistors, $R_{SR}$ and $R_{SH}$. Different levels of attenuation are provided by digitally controlling the variable resistors to change the level of resistance to correspond to a target level of attenuation.

Figure 6A:
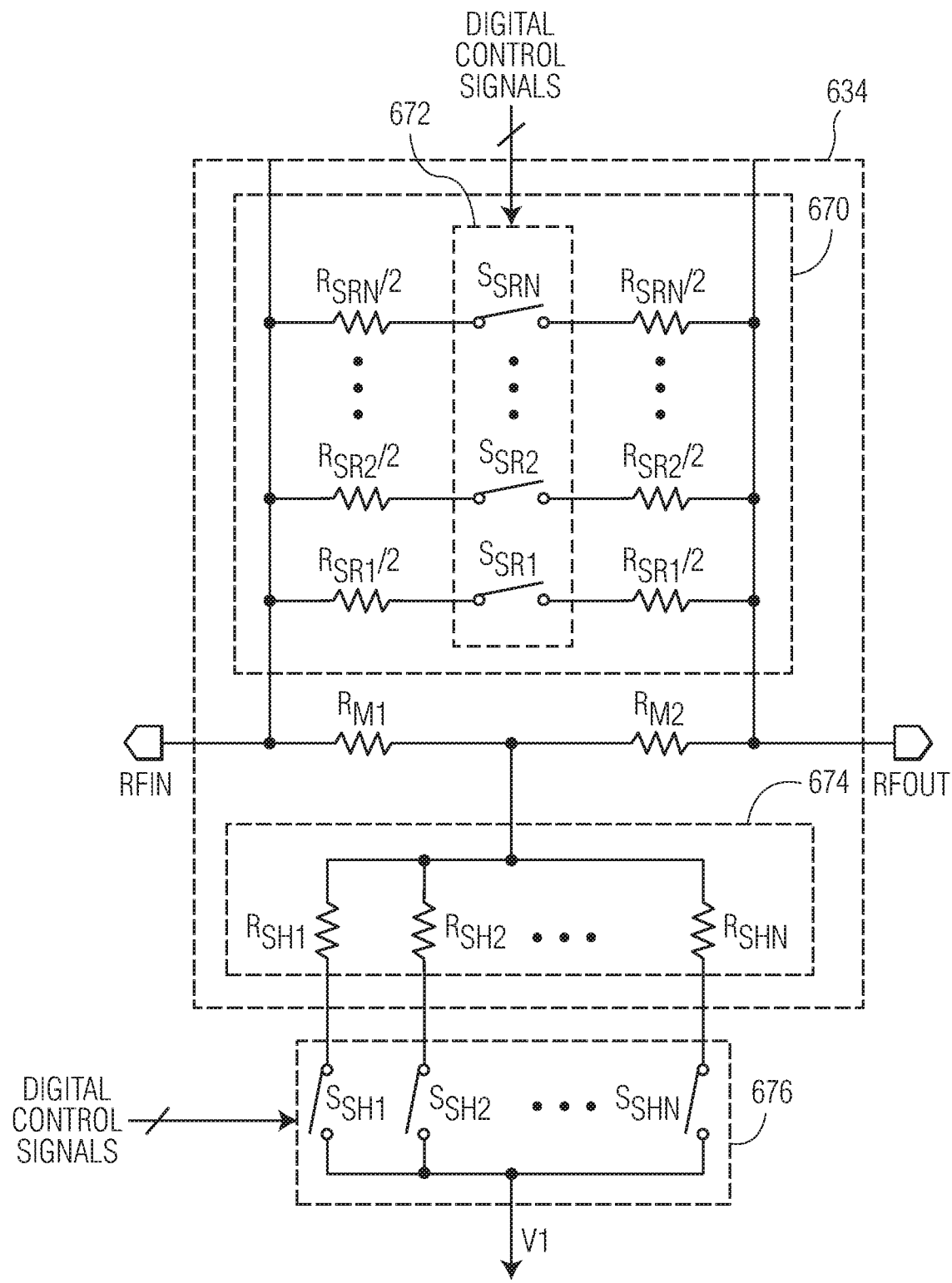
FIG. 6A depicts an embodiment of an attenuation circuit similar to the attenuation circuit of FIG. 5 in which digitally controllable resistor banks are substituted for the variable attenuation resistors.
Figure 6B:
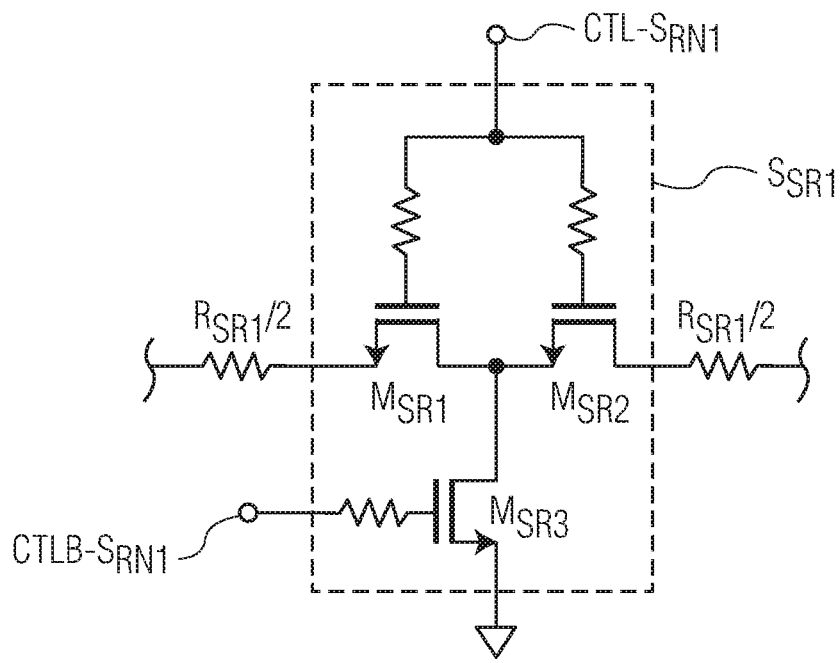
FIG. 6B depicts an expanded view of a switch from a resistor bank of FIG. 6A.

Various techniques can be implemented to provide digitally controllable variable resistance in a DSA that includes series connected first and second bypass resistors, $M_1$ and $M_2$, and a bypass shunt transistor, $M_3$, as described above with reference to FIGS. 2A-2D. FIG. 6A depicts an embodiment of an attenuation circuit 634 similar to the attenuation circuit 534 of FIG. 5 in which digitally controllable resistor banks are substituted for the variable attenuation resistors, $R_{SR}$ and $R_{SH}$. In the example of FIG. 6A, the variable attenuation resistor, $R_{SR}$, from FIG. 5 is embodied as a digitally controllable resistor bank 670 that includes a set of digitally controllable switches 672 (e.g., T-type series transistors) and resistors that are connectable in series via a respective switch. For example, a first row of the digitally controllable resistor bank 670 includes a resistor, $R_{SR1}/2$, a switch $S_{SR1}$, and a resistor, $R_{SR1}/2$, a second row of the digitally controllable resistor bank includes a resistor, $R_{SR2}/2$, a switch $S_{SR2}$, and a resistor, $R_{SR2}/2$, and an N-th row of the digitally controllable resistor bank includes a resistor, $R_{SRN}/2$, a switch $S_{SRN}$, and a resistor, $R_{SRN}/2$. Multiple rows of switch/resistors are connected in parallel between the RF input, RFIN, and the RF output, RFOUT, and each switch of the digitally controllable resistor bank 670 can be individually controlled to control whether or not a series connection is made within a particular row of resistors. For example, the switches $S_{SR1}$, $S_{SR2}$, and $S_{SRN}$, are T-type series switches as described with reference to FIG. 2A. FIG. 6B depicts and example of row 1 of the digitally controllable resistor bank from FIG. 6A, in which the switch $S_{SR1}$, is embodied as a T-type series switching having transistors, $M_{SR1}$, $M_{SR2}$, and $M_{sR3}$, similar to the transistor arrangement in the bypass switching circuit described with reference to FIG. 2A. In an embodiment, the transistors in the digitally controllable resistor bank have the same characteristics (e.g., same size, same materials, same structure) as the transistors in the bypass switching circuit in order to maintain continuity in phase shift amongst all of the transistors that make up the DSA. In an embodiment, the transistors, $M_{SR1-N}$, $M_{SR2-N}$, and $M_{SR3-N}$, may be controlled by respective switch control signals, CTL-$S_{SR1}$/CTLB-$S_{SR1}$, CTL-$S_{SR2}$/CTLB-$S_{SR2}$, and CTL-$S_{SRN}$/CTLB-$S_{SRN}$. Returning back to FIG. 6A and moving down, the variable attenuation resistor, $R_{SH}$, is embodied as a digitally controllable resistor bank 674 in which a set of parallel resistors are connected to corresponding switches in a set of digitally controllable shunt switches 676. For example, the digitally controllable resistor bank 674 includes a first resistor, $R_{SH1}$, connected to a shunt switch $S_{SH1}$, a second resistor, $R_{SH2}$, connected to a shunt switch $S_{SH2}$, and an N-th resistor, $R_{SHN}/2$, connected to a shunt switch $S_{SHN}$. Multiple columns of switches/resistors are connected in parallel between the second end of the first attenuation resistor, $R_{M1}$, and the second end of the second attenuation resistor, $R_{M2}$, and the voltage, V1, and each switch of the digitally controllable resistor bank 674 can be individually controlled to control whether or not a series connection is made within a particular row of resistors. For example, the switches $S_{SH1}$, $S_{SH2}$, and $S_{SHN}$, can be controlled by respective switch control signals, CTLB-$S_{SH1}$, CTLB-$S_{SH2}$, and CTLB-$S_{SHN}$. In an embodiment, the shunt switches are similar to the shunt transistor, $M_4$, as described with reference to FIG. 2A. In operation, the switches in the digitally controllable resistor bank 670 and the set of shunt switches 676 are individually controlled in response to digital control signals from digital control logic (not shown). For example, the level of attenuation can be controlled by the number of switches that are turned on and off to FIGS. 2A-2D to control the overall level of resistance and thus the level of attenuation.

Figure 7:
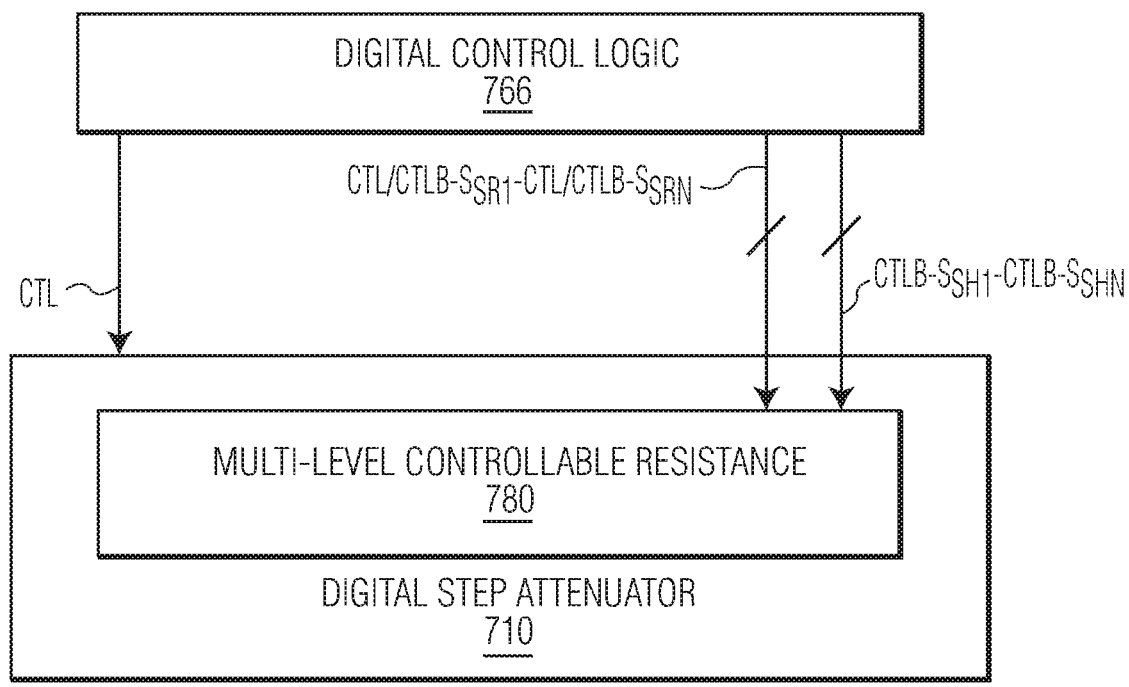
FIG. 7 depicts an embodiment of a DSA that includes multi-level controllable resistance, such as the multi-level controllable resistance described with reference to FIGS. 5 and 6.

FIG. 7 depicts an embodiment of a DSA 710 that includes multi-level controllable resistance 780, such as the multi-level controllable resistance described with reference to FIGS. 5 and 6. As illustrated in FIG. 7, the multi-level controllable resistance of the DSA is controlled by control signals from the digital control logic 766. For example, the control signals from the digital control logic control the state of switches (e.g., CTL/CTLB-$S_{SR1}$-CTL/CTLB-$S_{SRN}$ and CTLB-$S_{SH1}$-CTLB-$S_{SHN}$) in the digitally controllable resistor banks 670 and 674 shown in FIGS. 6A and 6B and the control signals, CTL and CTLB, control the state of the first bypass transistor, $M_1$, the second bypass transistor, $M_2$, the bypass shunt transistor, $M_3$, and the shunt transistor, $M_4$, as described above with reference to FIGS. 2A-2D.

Figure 8A:
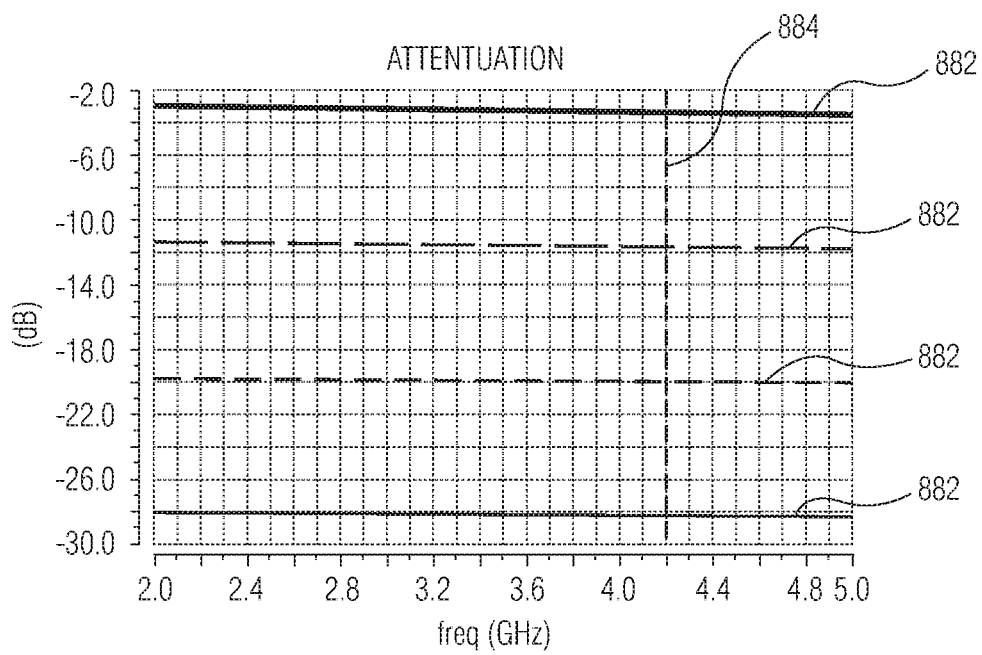
FIGS. 8A and 8B are example graphs of simulation results that show attenuation and phase shift, respectively, that is exhibited at four different levels of attenuation in a multi-level DSA as described above with reference to FIGS. 5-7.
Figure 8B:
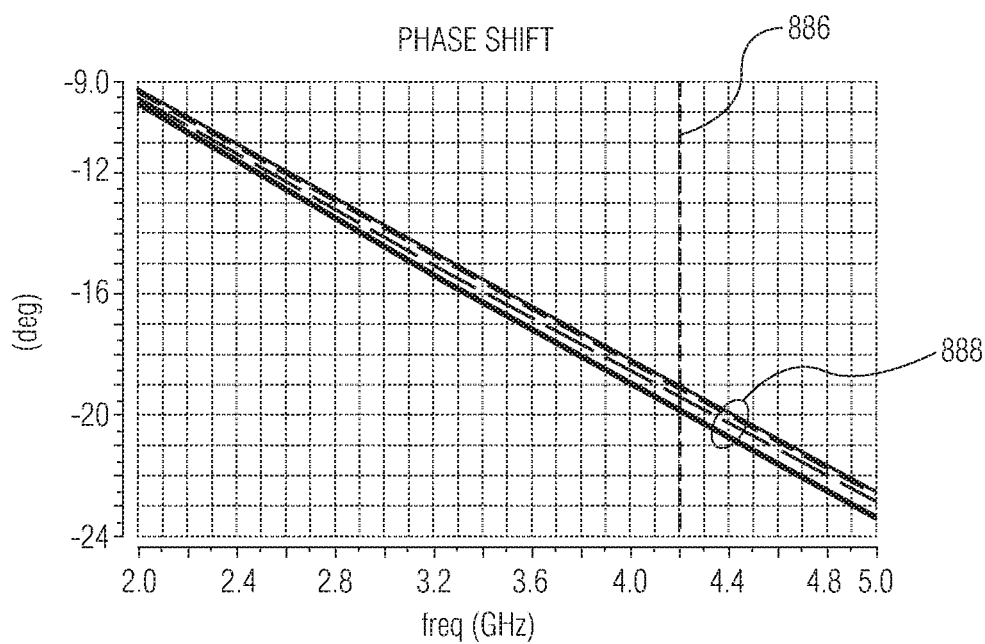

FIGS. 8A and 8B are example graphs of simulation results that show attenuation and phase shift, respectively, that is exhibited at four different levels of attenuation in a multi-level DSA as described above with reference to FIGS. 5-7. In the graph of FIG. 8A, the horizontal axis (x-axis) corresponds to frequency in gigahertz (GHz) from 2-5 GHz and the vertical access (y-axis) corresponds to attenuation (e.g., in dB). Further, FIG. 8A depicts four different attenuation levels (as indicated by horizontal dashed lines 882) at an operating frequency of 4.2 GHz (as indicated by the vertical dashed line 884), with the four different attenuation levels being approximately −3.0 dB, −11.0 dB, −20 dB, and −28 dB. In the graph of FIG. 8B, the horizontal axis (x-axis) corresponds to frequency in gigahertz (GHz) from 2-5 GHz and the vertical access (y-axis) corresponds to phase shift (e.g., in degrees) for the four different levels of attenuation that are shown in FIG. 8A at 4.2 GHz (as indicated by the vertical dashed line 886). Most importantly, the graph of FIG. 8B shows that the phase shift imparted on RF signals in the attenuation mode for each of the different attenuation levels (as indicated by the four diagonal lines 888) are closely aligned to each other across the range of frequencies. In the example simulation depicted in FIGS. 8A and 8B, it was found that the phase shift between the different levels of attenuation in the attenuation mode varied less than 1.0 degree over the 2-5 GHz frequency range. Thus, the DSA as described herein provides strong phase coherence across a wide frequency range.

Figure 9:
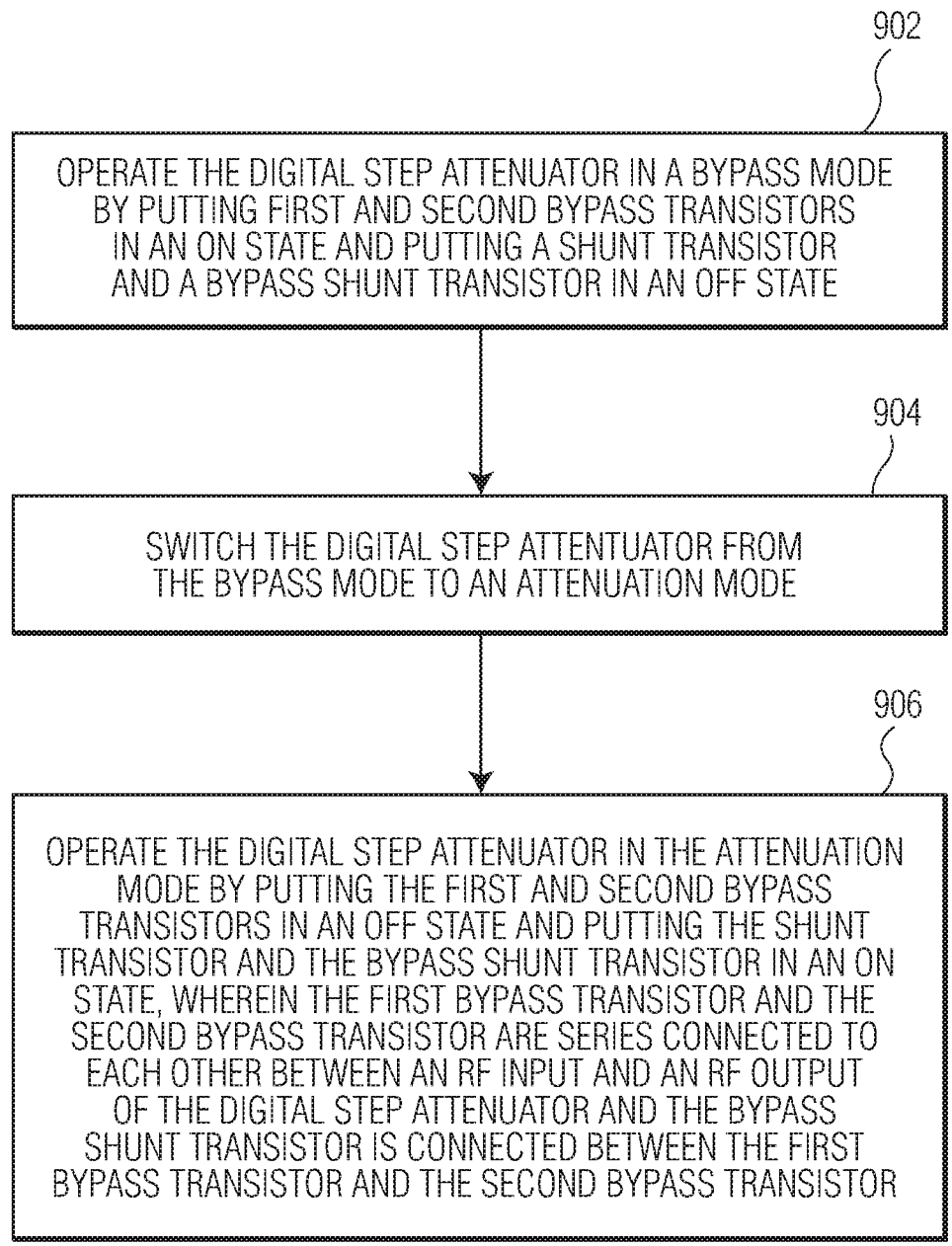
FIG. 9 is a process flow diagram of a method for operating a digital step attenuator.

FIG. 9 is a process flow diagram of a method for operating a digital step attenuator. At block 902, the digital step attenuator is operated in a bypass mode by putting first and second bypass transistors in an on state and putting a shunt transistor and a bypass shunt transistor in an off state. At block 904, the digital step attenuator is switched from the bypass mode to an attenuation mode. At block 906, the digital step attenuator is operated in the attenuation mode by putting the first and second bypass transistors in an off state and putting the shunt transistor and the bypass shunt transistor in an on state, wherein the first bypass transistor and the second bypass transistor are series connected to each other between an RF input and an RF output of the digital step attenuator, and the bypass shunt transistor is connected between the first bypass transistor and the second bypass transistor.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A digital step attenuator comprising:
    a radio frequency (RF) input;
    an RF output;
    an attenuation circuit connected between the RF input and the RF output;
    a shunt switching circuit connected to the attenuator circuit; and
    a bypass switching circuit connected between the RF input and the RF output, the bypass switching circuit including:
        a first bypass transistor, and
        a second bypass transistor,
            wherein the first bypass transistor and the second bypass transistor are series connected to each other between the RF input and the RF output; and
        a bypass shunt transistor connected between the first bypass transistor and the second bypass transistor;
    wherein;
        gates of the first bypass transistor and the second bypass transistor are connected to a first gate terminal; and
        gates of a shunt transistor of the shunt switching circuit and of the bypass shunt transistor are connected to a second gate terminal.

2. The digital step attenuator of claim 1, wherein the bypass shunt transistor is configured such that a parasitic capacitance of the bypass shunt transistor is matched between a bypass mode and an attenuation mode.

3. The digital step attenuator of claim 1, wherein:
    the gate of the first bypass transistor is connected, via a first gate resistor, to the first gate terminal, and the gate of the second bypass transistor is connected, via a second gate resistor, to the first gate terminal; and
    the gate of the bypass shunt transistor is electrically connected, via a third gate resistor, to the second gate terminal.

4. The digital step attenuator of claim 3, wherein:
    the gate of the shunt transistor is electrically connected, via a fourth gate resistor, to the second gate terminal.

5. The digital step attenuator of claim 4, wherein the bypass shunt transistor is configured such that a parasitic capacitance of the bypass shunt transistor is matched between a bypass mode and an attenuation mode.

6. The digital step attenuator of claim 1, wherein:
    the first and second bypass transistors are n-type transistors in which a source of the first bypass transistor is electrically connected to the RF input, a drain of the first bypass transistor is electrically connected to a source of the second bypass transistor, and a drain of the second bypass transistor is electrically connected to the RF output;
    the gate of the first bypass transistor is connected, via a first gate resistor, to the first gate terminal, and the gate of the second bypass transistor is connected, via a second gate resistor, to the first gate terminal;
    the bypass shunt transistor is electrically connected between the first bypass transistor and the second bypass transistor, the bypass shunt transistor is an n-type transistor that includes a drain electrically connected between the drain of the first bypass transistor and the source of the second bypass transistor, and the gate of the bypass shunt transistor is electrically connected, via a third gate resistor, to the second gate terminal.

7. The digital step attenuator of claim 1, wherein the attenuation circuit includes a first attenuation resistor, a second attenuation resistor, a third attenuation resistor, and a fourth attenuation resistor, wherein the third attenuation resistor is electrically connected in parallel with the first and second attenuation resistors, and the fourth attenuation resistor is electrically connected between a second end of the first attenuation resistor and a first end of the second attenuation resistor.

8. The digital step attenuator of claim 1, wherein the attenuation circuit includes a first attenuation resistor, a second attenuation resistor, a first digitally controllable resistor bank, and a second digitally controllable resistor bank, wherein the first digitally controllable resistor bank is electrically connected in parallel with the first and second attenuation resistors, and the second digitally controllable resistor bank is electrically connected between a second end of the first attenuation resistor and a first end of the second attenuation resistor.

9. The digital step attenuator of claim 8, wherein the first digitally controllable resistor bank includes resistors and switches corresponding to the resistors, wherein the switches can be turned on or off to set a level of resistance that is provided by the first digitally controllable resistor bank, and wherein the second digitally controllable resistor bank includes resistors and switches corresponding to the resistors, wherein the switches can be turned on or off to set a level of resistance that is provided by the second digitally controllable resistor bank.

10. The digital step attenuator of claim 1, wherein the RF input, the RF output, the attenuation circuit, the shunt switching circuit, and the bypass switching circuit comprise a unit digital step attenuator, the digital step attenuator including multiple unit digital step attenuators electrically connected to each other.

11. A method for operating a digital step attenuator, the method comprising:
operating the digital step attenuator in a bypass mode by putting first and second bypass transistors in an on state and putting a shunt transistor and a bypass shunt transistor in an off state;
switching the digital step attenuator from the bypass mode to an attenuation mode; and
operating the digital step attenuator in the attenuation mode by putting the first and second bypass transistors in an off state and putting the shunt transistor and the bypass shunt transistor in an on state;
wherein the first bypass transistor and the second bypass transistor are series connected to each other between a radio frequency (RF) input and an RF output of the digital step attenuator, and the bypass shunt transistor is connected between the first bypass transistor and the second bypass transistor;
wherein the first and second bypass transistors are controlled by a first control signal and the shunt transistor and bypass shunt transistor are controlled by a second control signal.

12. The method of claim 11, wherein the bypass shunt transistor is configured such that a parasitic capacitance of the bypass shunt transistor is matched between a bypass mode and an attenuation mode.

13. A radio frequency (RF) system comprising:
a digital step attenuator including:
an RF input,
an RF output,
an attenuation circuit connected between the RF input and the RF output, and
a shunt switching circuit connected to the attenuator circuit, the shunt switching circuit including a shunt transistor, and
a bypass switching circuit connected between the RF input and the RF output, the bypass switching circuit including:
a first bypass transistor,
a second bypass transistor,
wherein the first bypass transistor and the second bypass transistor are series connected to each other between the RF input and the RF output, and
a bypass shunt transistor connected between the first bypass transistor and the second bypass transistor;
wherein
gates of the first bypass transistor and the second bypass transistor are electrically connected to a first gate terminal, and
gates of the shunt transistor and the bypass shunt transistor are connected to a second gate terminal.

14. The RF system of claim 13, wherein the bypass shunt transistor is configured such that a parasitic capacitance of the bypass shunt transistor is matched between a bypass mode and an attenuation mode.

15. The RF system of claim 13, further comprising:
digital control logic that is configured to provide control signals to the digital step attenuator to control the state of the first and second bypass transistors and to provide control signals to the bypass shunt transistor to control the state of the bypass shunt transistor.

16. The RF system of claim 13, wherein:
the first and second bypass transistors are n-type transistors in which a source of the first bypass transistor is electrically connected to the RF input, a drain of the first bypass transistor is electrically connected to a source of the second bypass transistor, and a drain of the second bypass transistor is electrically connected to the RF output;
a gate of the first bypass transistor is connected, via a first gate resistor to a first gate terminal, and a gate of the second bypass transistor is connected, via a second gate resistor to the first gate terminal; and
the bypass shunt transistor is electrically connected between the first bypass transistor and the second bypass transistor, the bypass shunt transistor is an n-type transistor that includes a drain electrically connected between the drain of the first bypass transistor and the source of the second bypass transistor, a gate of the bypass shunt transistor is electrically connected, via a third gate resistor to a second gate terminal.

\* \* \* \* \*